(12) United States Patent  
Balmelli

(10) Patent No.: US 8,872,554 B2
(45) Date of Patent: Oct. 28, 2014

(54) EXTERNALLY CONFIGURABLE POWER-ON-RESET SYSTEMS AND METHODS FOR INTEGRATED CIRCUITS

(75) Inventor: Pio Balmelli, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 0 days.

(21) Appl. No.: 13/362,138

(22) Filed: Jan. 31, 2012

(65) Prior Publication Data
US 2013/0176065 A1 Jul. 11, 2013

Related U.S. Application Data

(60) Provisional application No. 61/583,891, filed on Jan. 6, 2012.

(51) Int. Cl.
*H03L 7/00* (2006.01)
(52) U.S. Cl.
USPC .............. 327/143; 327/77; 327/198; 327/205
(58) Field of Classification Search
USPC ............ 327/143, 198, 77, 78, 80, 81, 85, 205
See application file for complete search history.

(56) References Cited

U.S. PATENT DOCUMENTS

| | | | |
|---|---|---|---|
| 4,874,965 A | 10/1989 | Campardo et al. | 307/272.3 |
| 5,166,546 A | 11/1992 | Savignac et al. | 307/296.5 |
| 5,394,104 A * | 2/1995 | Lee | 327/143 |
| 5,469,099 A | 11/1995 | Konishi | 327/198 |
| 6,144,238 A | 11/2000 | Dasgupta | 327/143 |
| 6,160,429 A | 12/2000 | Morrill | 327/143 |
| 7,055,064 B2 | 5/2006 | Lin | 714/23 |
| 7,091,758 B2 | 8/2006 | Chun et al. | 327/143 |
| 7,135,898 B2 | 11/2006 | Tseng et al. | 327/143 |
| 7,586,350 B2 * | 9/2009 | Chung et al. | 327/143 |
| 7,788,515 B2 | 8/2010 | Wong et al. | 713/330 |

* cited by examiner

*Primary Examiner* — Long Nguyen
(74) *Attorney, Agent, or Firm* — Egan, Peterman & Enders LLP.

(57) ABSTRACT

Externally configurable power-on-reset systems and methods for integrated circuits are disclosed that utilize internal power-on-reset circuitry and reset control circuitry to provide operational configurations determined by external connections. In one configuration where no dedicated external reset signal is desired, the reset control circuitry relies upon the internal power-one-reset circuitry to generate the internal reset control signal. In another configuration where an external reset signal is utilized, the reset control circuitry relies upon the external reset signal, which overrides the internal power-on-reset circuitry, to generate the internal reset control signal. In further configurations, the reset control circuitry utilizes logic circuitry controlled through a digital interface to determine when the internal reset control signal can be de-asserted.

20 Claims, 7 Drawing Sheets

EXTERNALLY CONFIGURABLE POWER-ON-RESET SYSTEMS AND METHODS FOR INTEGRATED CIRCUITS

RELATED APPLICATIONS

This application claims priority to the following co-pending provisional application: U.S. Provisional Patent Application Ser. No. 61/583,891, filed Jan. 6, 2012, and entitled "EXTERNALLY CONFIGURABLE POWER-ON-RESET SYSTEMS AND METHODS FOR INTEGRATED CIRCUITS," which is hereby incorporated by reference in its entirety.

TECHNICAL FIELD OF THE INVENTION

This invention relates to power-on-reset operations for integrated circuits and, more particularly, to power-on-reset operations for television tuner integrated circuits.

BACKGROUND

Many integrated circuits include digital circuits that require a reset operation of some sort before these digital circuits are capable of operating properly. For example, a power-on-reset may be required after a system has been powered "on" or after a system has been woken up from a low-power sleep mode.

Integrated television (TV) tuners that include digital circuits are such integrated circuits that utilize power-on-reset signals to provide for proper operation of the digital circuits. Because of compatibility issues with older analog TV tuners, some TV module manufacturers are unable to provide external reset signals to TV tuner integrated circuits that include digital circuits needing such reset signals. One prior solution to this problem has been to add external power-on-reset (POR) circuitry to a TV module printed circuit board, and this external POR circuitry then provides an external reset signal to a TV tuner integrated circuit mounted on the TV module. However, this additional external POR circuitry increases cost of the TV module.

FIG. 1 (Prior Art) is a block diagram of an embodiment 100 that utilizes external POR circuitry 106 to provide an external reset signal 108 to a integrated circuit (IC) 102, which can be a TV tuner IC if desired. As depicted, the external reset signal 108 is provided to a reset pin 110 for the integrated circuit 102, and this external reset signal 108 is used to provide an internal reset signal 104 for the digital circuitry within the integrated circuit 102. The POR circuitry 106 can be implemented to use standard POR circuitry that monitors the supply voltage 112 and provides the external reset signal 108 when the supply voltage 112 has reached a threshold voltage level that is sufficiently high to provide successful operation of the integrated circuit 102. As stated above, this external POR circuitry 106 adds undesirable cost.

SUMMARY OF THE INVENTION

Externally configurable power-on-reset systems and methods for integrated circuits are disclosed that utilize internal power-on-reset circuitry and reset control circuitry to provide operational configurations determined by external connections. In one configuration where no dedicated external reset signal is desired, the reset control circuitry relies upon the internal power-one-reset circuitry to generate the internal reset control signal. In another configuration where an external reset signal is utilized, the reset control circuitry relies upon the external reset signal, which overrides the internal power-on-reset circuitry, to generate the internal reset control signal. In further configurations, the reset control circuitry utilizes logic circuitry controlled through a digital interface to determine when the internal reset control signal can be de-asserted. The systems and methods disclosed can be used with any desired integrated circuit, but are particularly useful for television tuner integrated circuits so that a single integrated television tuner can be used to satisfy television module solutions that require an external reset signal and also to satisfy television module solutions that do not require an external reset signal. And this configurability is provided without requiring internal modifications to the integrated circuit or its packaging. Other features and variations could also be implemented, as desired, and related systems and methods can be utilized, as well.

DESCRIPTION OF THE DRAWINGS

It is noted that the appended drawings illustrate only example embodiments of the invention and are, therefore, not to be considered limiting of its scope, for the invention may admit to other equally effective embodiments.

DETAILED DESCRIPTION OF THE INVENTION

Externally configurable power-on-reset systems and methods for integrated circuits are disclosed that utilize internal power-on-reset circuitry and reset control circuitry to provide operational configurations determined by external connections. In one configuration where no dedicated external reset signal is desired, the reset control circuitry relies upon the internal power-one-reset circuitry to generate the internal reset control signal. In another configuration where an external reset signal is utilized, the reset control circuitry relies upon the external reset signal, which overrides the internal power-on-reset circuitry, to generate the internal reset control signal. In further configurations, the reset control circuitry utilizes logic circuitry controlled through a digital interface to determine when the internal reset control signal can be de-asserted. The systems and methods disclosed can be used with any desired integrated circuit, but are particularly useful for television tuner integrated circuits so that a single integrated television tuner can be used to satisfy television module solutions that require an external reset signal and also to satisfy television module solutions that do not require an external reset signal. And this configurability is provided without requiring internal modifications to the integrated circuit or its packaging. Other features and variations could also be implemented, as desired, and related systems and methods can be utilized, as well.

Advantageously, the embodiments described herein remove the need of a dedicated external reset signal, while still allowing for its use, if desired. This advantageous result is achieved in part by generating an internal reset signal based upon internal power-on-reset (POR) circuitry. The operational mode selection between internal reset signal and external reset signal is configured to be selected by choice of external connections for the integrated circuit. As such, this mode selection is provided without requiring different IC designs, different packaging options and/or different bonding options that would increase the expense of the different configurations.

Figure 1:
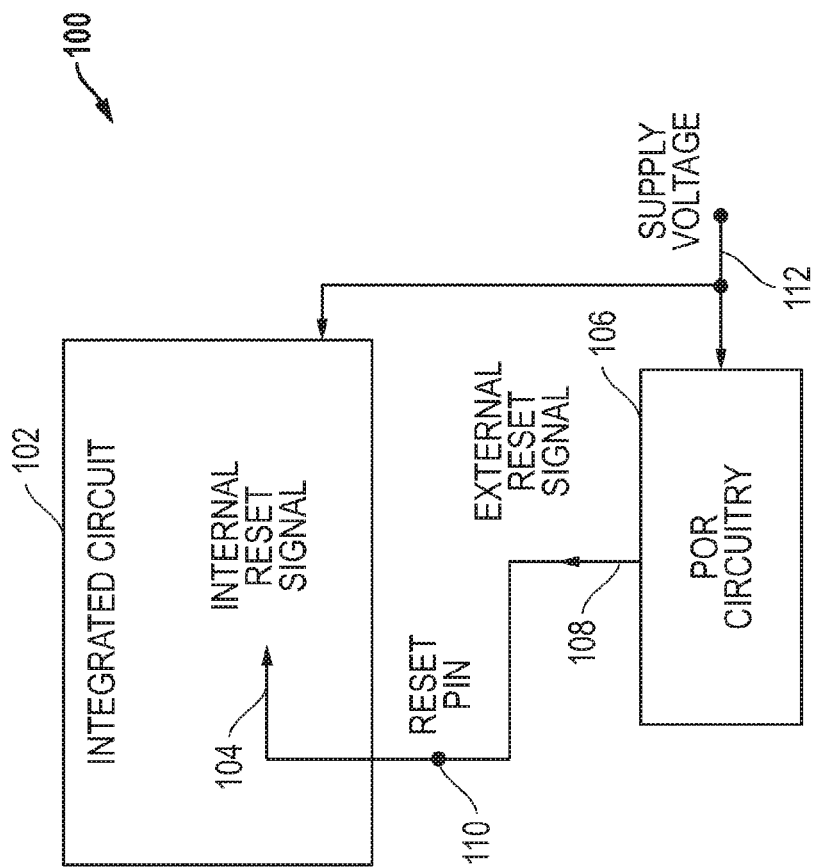
FIG. 1 (Prior Art) is a block diagram for a prior solution that utilizes external power-on-reset circuitry to generate an external reset signal for an integrated circuit.
Figure 2:
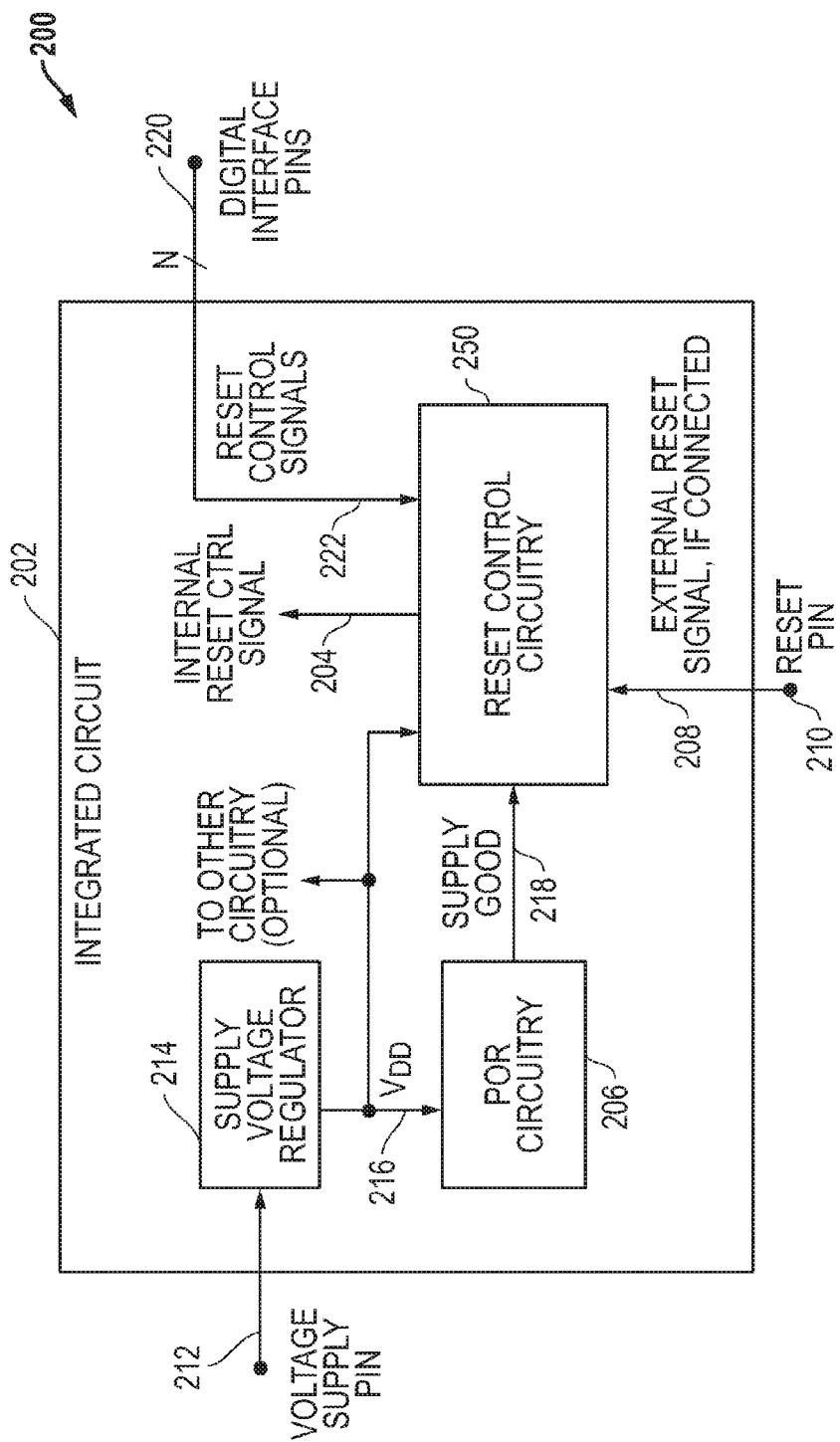
FIG. 2 is a block diagram for an integrated circuit having internal power-on-reset and reset control circuitry.

FIG. 2 is a block diagram of an embodiment 200 for an integrated circuit (IC) 202, such as a television (TV) tuner integrated circuit, having internal reset control circuitry 250 and internal power-on-reset (POR) circuitry 206. For the embodiment depicted, the supply voltage regulator 214 is coupled to receive an external supply voltage through the voltage supply pin 212 and is configured to provide a regulated supply voltage ($V_{DD}$) 216 to the POR circuitry 206 and the reset control circuitry 250. The regulated supply voltage ($V_{DD}$) 216 can also optionally be provided to other on-chip circuitry, if desired. Further, it is noted that the supply voltage regulator 214 is optional, and an unregulated supply voltage ($V_{DD}$) could also be utilized, if desired. The POR circuitry 206 monitors the level of the regulated supply voltage ($V_{DD}$) 216 and determines when the regulated supply voltage ($V_{DD}$) 216 has achieved an adequate voltage level to successfully operate the circuitry to which it is connected. When this voltage level has been achieved, the POR circuitry 206 generates a supply-good signal 218 that indicates that that supply voltage is ready, and operation of the related circuitry can begin. The POR circuitry 206 can be implemented, as desired, using standard power-on-reset circuits that indicate when an adequate supply voltage has been achieved. The additional reset control circuitry 250 described herein provides the operational advantages of allowing for multiple modes of operation including the use of an external reset signal and the non-use of such an external reset signal.

The reset control circuitry 250 is configured to provide the internal reset control signal 204 that is utilized by the integrated circuit 202 to indicate when operations can begin for circuitry utilizing the supply voltage ($V_{DD}$) 216. In addition to being coupled to the POR circuitry 206, the reset control circuitry 250 is also coupled to the reset pin 210 to receive an external reset signal 208 if an external reset signal is applied to the reset pin 210. Thus, in operation, the reset control circuitry 250 can utilize the supply-good signal 218 from the internal POR circuitry 206 or the external reset signal 208 (if connected) to determine when the internal reset control signal 204 is asserted. The internal reset control signal 204 is preferably configured to control the reset condition for the rest of the integrated circuit 202.

The reset control circuitry 250 can also be coupled to receive reset control signals 222 from a digital interface, such as through one or more digital interface pins (N) 220. In this configuration, the reset control signals 222 are utilized by the reset control circuitry 250 to determine when the internal reset control signal 204 can be de-asserted. In other words, even if the internal supply-good signal 218 is de-asserted or the external reset signal 208 (if connected) is de-asserted, the internal reset control signal 204 will not be de-asserted until the reset control signals 222 from the digital interface pins 220 indicate that the internal reset control signal 204 can be de-asserted. It is noted that a two-pin I2C interface can be utilized as the digital interface associated with digital interface pins 220, if desired.

It is further noted that using digital interface pins 220 to provide reset control signals 222 to release the internal reset control signal 204 is primarily desirable where the integrated circuit has separate supply voltages (i.e., other than supply voltage ($V_{DD}$) 216) that can still be down when the POR circuitry 206 releases the supply-good (vdd_goodb) signal 218. As the POR circuitry 206 is only monitoring supply voltage ($V_{DD}$) 216 in the embodiments depicted, a direct release of the internal reset control signal 204 based upon the supply-good (vdd_goodb) signal 218 could lead to other sections of the integrated circuit not being ready for operation. For example, if a different supply voltage were being used for an analog portion of the integrated circuit, a direct release of the internal reset control signal 204 based solely upon the supply-good (vdd_goodb) signal 218 could occur before this other analog supply voltage is ready for operation. It is assumed a host controller or processor will know when all the voltage supplies for the integrated circuit are ready for operation. As such, the host controller or processor can issue an appropriate command through the digital interface pins 220 when the internal reset control signal 204 can safely be released, starting operation of the integrated circuit. As noted herein, if the entire integrated circuit is using the same voltage supply ($V_{DD}$) 216 that is monitored by the POR circuitry 206, or if POR circuitry for every voltage supply is provided and an aggregated reset signal is generated, then the reset control signals 222 provided through digital interface 220 would not be needed.

Figure 3A:
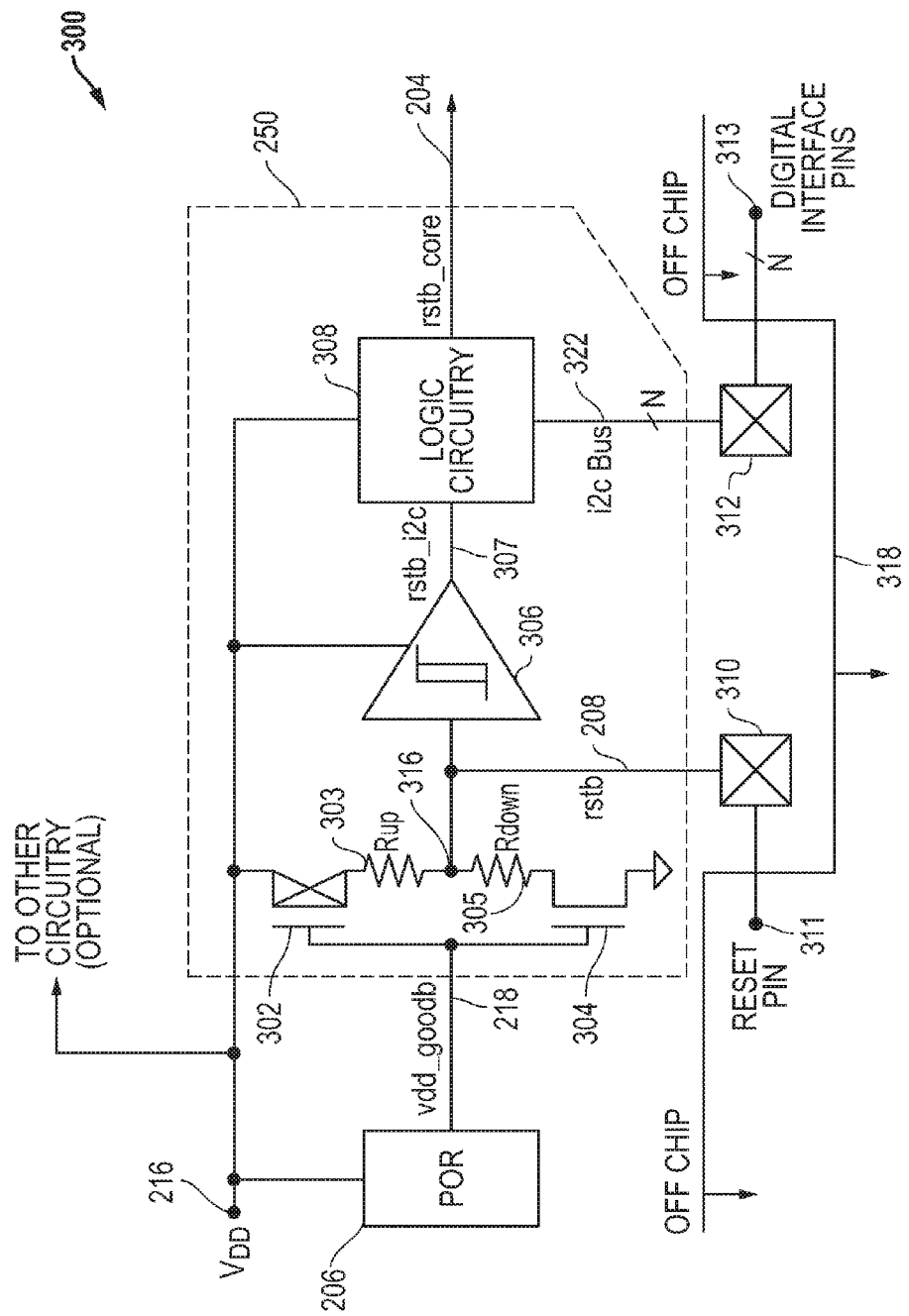
FIG. 3A is an example circuit diagram for internal power-one-reset and reset control circuitry.

FIG. 3A is a circuit diagram for internal POR circuitry 206 and reset control circuitry 250. As depicted for embodiment 300, the internal POR circuitry 206 is coupled to internal reset control circuitry 250. The internal POR circuitry 206 is also coupled to an on-chip supply voltage 216 ($V_{DD}$), which can be unregulated or can be regulated as described with respect to FIG. 2. As described above, the internal POR circuitry 206 is configured to assert a supply-good signal 218, labeled as "vdd_goodb," when the supply voltage ($V_{DD}$) 216 has reached an adequate level for successfully resetting the circuitry powered by this supply voltage ($V_{DD}$) 216. This supply-good signal (vdd_goodb) 218 is provided to the reset control circuitry 250.

For the embodiment 300 depicted, the reset control circuitry 250 includes an inverter formed by transistors 302 and 304, a Schmitt trigger 306, and logic circuitry 308. More particularly, the supply-good signal (vdd_goodb) 218 is provided to the gate of PMOS transistor 302 and to the gate of NMOS transistor 304. The drain and source of PMOS transistor 302 are coupled between the supply voltage ($V_{DD}$) 216 and pull-up resistor ($R_{UP}$) 303, which is also coupled to node 316. The drain and source of NMOS transistor 304 are coupled between the supply voltage ($V_{DD}$) 216 and the pull-down resistor ($R_{DOWN}$) 305, which is also coupled to node 316. In operation, the inverter formed by transistors 302 and 304 produces an output signal on node 316 that is an inverted version of the supply-good signal (vdd_goodb) 218.

The Schmitt trigger 306 receives the inverted signal on node 316 and outputs a reset signal 307, labeled "rstb_i2c," to logic circuitry 308. The input to the Schmitt trigger 306 is also coupled to the input reset pad 310, which is in turn coupled to the reset pin 311. As such, if an external reset signal is applied to the reset pin 311, this external reset signal will be provided on signal line 208, labeled as "rstb," to node 316. Preferably, if applied, the impedance associated with the external reset signal is much less than the impedance of the pull-down resistor ($R_{DOWN}$) 305 and the pull-up resistor ($R_{UP}$) 303, and the external reset signal will control the voltage on node 316, overriding the signal from the POR circuitry 206. In operation, the reset signal (rstb_i2c) 307 from the Schmitt trigger 306 will move from a low logic level to a high logic level or from a high logic level to a low logic level according to the voltage on node 316. It is noted that the Schmitt trigger 306 is utilized to filter noise that might be present on node 316 during a slow rising edge, thereby reducing or preventing the reset signal (rstb_i2c) 307 from chattering. It is further noted that the threshold transition levels for the Schmitt trigger 306 can be configured, as desired. However, it is preferable that the Schmitt trigger operates with a wide hysteresis with respect to its voltage level transitions.

In addition to the reset signal (rstb_i2c) 307 from the Schmitt trigger 306, logic circuitry 308 also receives reset control signals from a digital interface bus 322, labeled "i2c bus." The digital interface bus (i2c_bus) 322 is coupled to one or more input pads 312 that are in turn coupled to one or more (N) digital interface pins 313. In operation, the logic circuitry 308 receives the reset signal (rstb_i2c) 307 from the Schmitt trigger 306 that indicates when the supply voltage 216 ($V_{DD}$) is ready for use and asserts the internal reset control signal 204, labeled "rstb_core." However, for this embodiment, the logic circuitry 308 will not de-assert the internal reset control signal (rstb_core) 204 unless a release command has been received through the digital interface bus 322 indicating that the reset can be de-asserted.

It is noted that the reset pin 311 and the digital interface pins 313 are off-chip as represented by line 318. It is also noted that the digital interface can be a 2-pin I2C interface, if desired. The logic circuitry can be implemented, for example, using an on-chip microcontroller, a finite state machine (FSM) and/or other logic circuitry, as desired. And described herein, this logic circuitry is configured to provide digital interface control, to assert the internal reset control signal 204 based upon reset signals from the POR circuitry 206, to assert the internal reset control signal based upon external reset signals applied to the reset pin 311, and to de-assert the internal reset control signal 204 when an appropriate command has been received through the digital interface. The logic circuitry can also be configured to assert the reset control signal 204 based upon an appropriate command received through the digital interface. Further, it is noted that the signals described herein can be implemented as active/asserted in a low logic level or active/asserted in a high logic level, as desired.

In one example, the internal reset control signal (rstb_core) 204 indicates a reset for the integrated circuit when at a low logic level and a release or de-assertion of the reset for the integrated circuit when at a high logic level. The reset signal (rstb_i2c) 307 from the Schmitt trigger 306 also indicates a reset when at a low logic level and a release or de-assertion of the reset when at a high logic level. The supply-good signal (vdd_goodb) 218 will be forced to a low logic level by the POR circuitry 206 when the supply voltage ($V_{DD}$) 216 has reached a adequate threshold voltage, thereby driving node 316 to a high voltage level through PMOS transistor 302. The Schmitt trigger 306 will then output a high logic level for the reset signal (rstb_i2c) 307. It is noted that as supply voltage ($V_{DD}$) 218 ramps up during initialization or restart of the integrated circuit, the voltage on the signal line for the supply-good signal (vdd_goodb) 218 will tend to rise along with the supply-good signal (vdd_goodb) 218 until it reaches an adequate level at which point the POR circuitry 206 will drive the supply-good signal (vdd_goodb) 218 to a low logic level. As such, during this initialization or restart, the voltage on node 316 will remain low through transistor 304, and the Schmitt trigger 306 will output a low logic level for the reset signal (rstb_i2c) 307. As indicated above, the Schmitt trigger 306 is preferably configured to have a wide hysteresis. For example, the Schmitt trigger 306 can be configured such that the voltage level where it transitions from low to high is about one volt or more higher than the voltage level where it transitions from high to low. The Schmitt trigger 306 can also be configured, if desired, such that the voltage level where it transitions from low to high is about 30 percent of the supply voltage range or more higher than the voltage level where it transitions from high to low. It is again noted that variations could be implemented as desired, and the signals described herein can be implemented as active/asserted in a low logic level or active/asserted in a high logic level, as desired.

Advantageously, the embodiments described herein provide for different operational configurations that are determined by external connections. In one configuration where no dedicated external reset signal is desired, the described embodiments rely upon internal POR circuitry to generate an internal reset control signal, thereby allowing for removal of the external POR circuitry and reducing the build-of-materials (BoM). In another configuration where an external reset signal is utilized, the described embodiments rely upon an external reset signal, thus reducing or removing power supply ramp-up constraints that might be required by POR circuitry. In contrast with prior solutions, both operational configurations are provided using the same integrated circuit (IC) without requiring different bonding options and/or IC packaging options. Instead, the operational mode is configured to be selected by the external components or connections coupled to the reset pin of the IC. Further, the described embodiments can be used for ICs that utilize more than one internal supply voltage and are particularly useful for television tuner ICs.

As described with respect to embodiment 300 in FIG. 3A, the reset control circuitry 250 can be implemented using an inverter 302/304 with a pull-up impedance ($R_{UP}$) 303 and a pull-down impedance ($R_{DOWN}$) 305, a Schmitt trigger 306, logic circuitry 308, and a reset pad 310. This reset control circuitry 250 can be configured to receive a supply-good signal (vdd_goodb) 218 from POR circuitry 206 and to output an internal reset control signal (rstb_core) 204. The operational mode for the reset control circuitry 250 can then be selected based upon the external circuitry coupled to the reset pad 310. In one example operational configuration as described in more detail in FIG. 3B, the reset pad 310 is left as a floating node. In this operational configuration, the internal POR circuitry 206 controls node 316 to provide a reset signal to the Schmitt trigger 306. In another example operational configuration as described in more detail with respect to FIG. 3C, the reset pad 310 is coupled to an external reset signal through the reset pin 311. In this operational configuration, the external control signal that is coupled to the reset pin 311 overrides the supply-good signal (vdd_goodb) 218 from the POR circuitry 206 and controls node 316 to provide the reset signal to the Schmitt trigger 306.

Figure 3B:
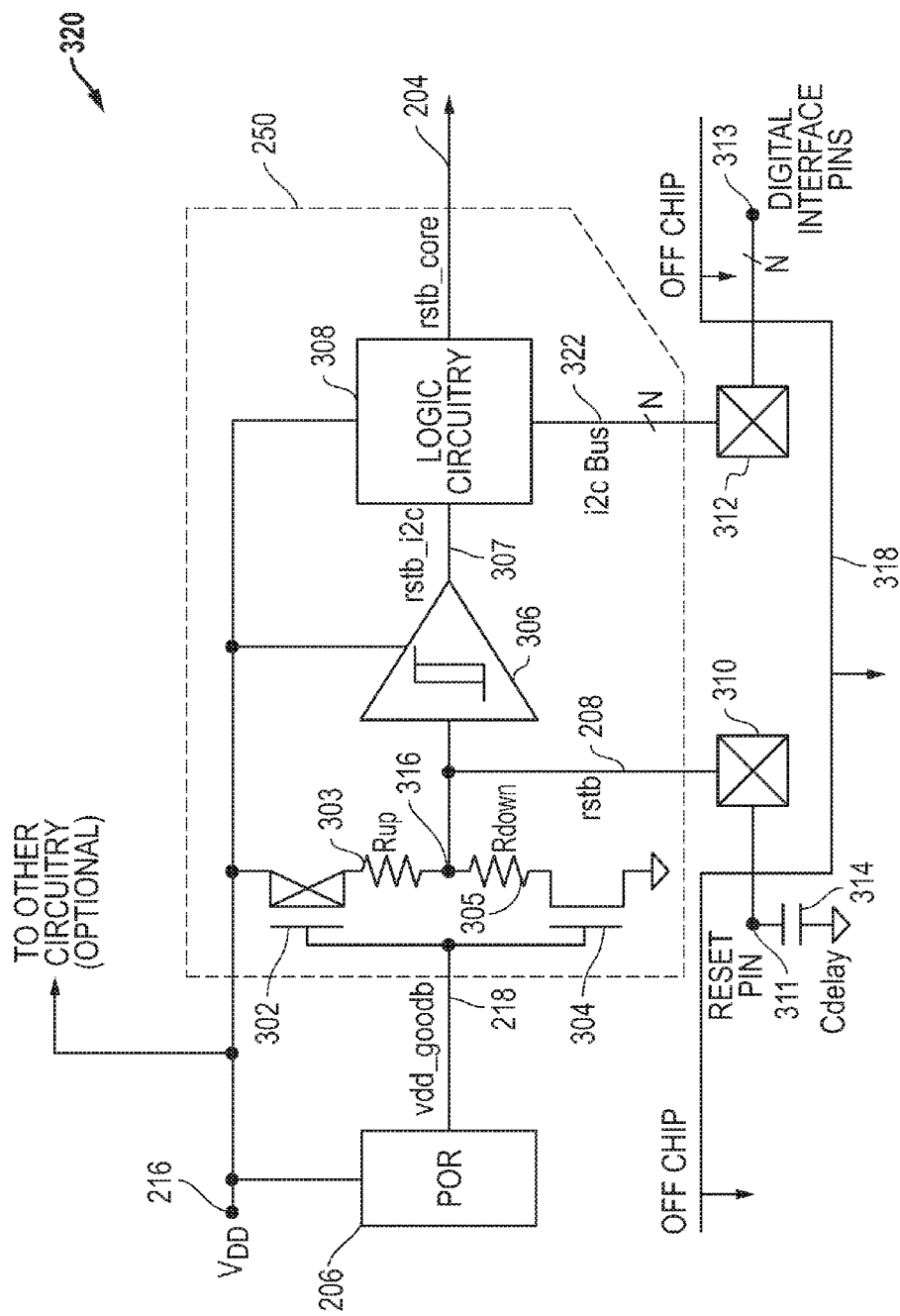
FIG. 3B is a circuit diagram for the embodiment of FIG. 3A where the internal reset control circuitry is configured to rely upon an internal reset signal from the power-on-reset circuitry.

FIG. 3B is a circuit diagram for the embodiment of FIG. 3A where the internal reset control signal (rstb_core) 204 is configured to depend upon an internal supply-good signal (vdd_goodb) 218 from on-chip POR circuitry 206. In particular, for embodiment 320 depicted, the reset pad 310 is left as a floating node. If desired, a capacitor ($C_{DELAY}$) 314 can be coupled to the reset pin 311, for example, between the reset pin 311 and ground.

Figure 3C:
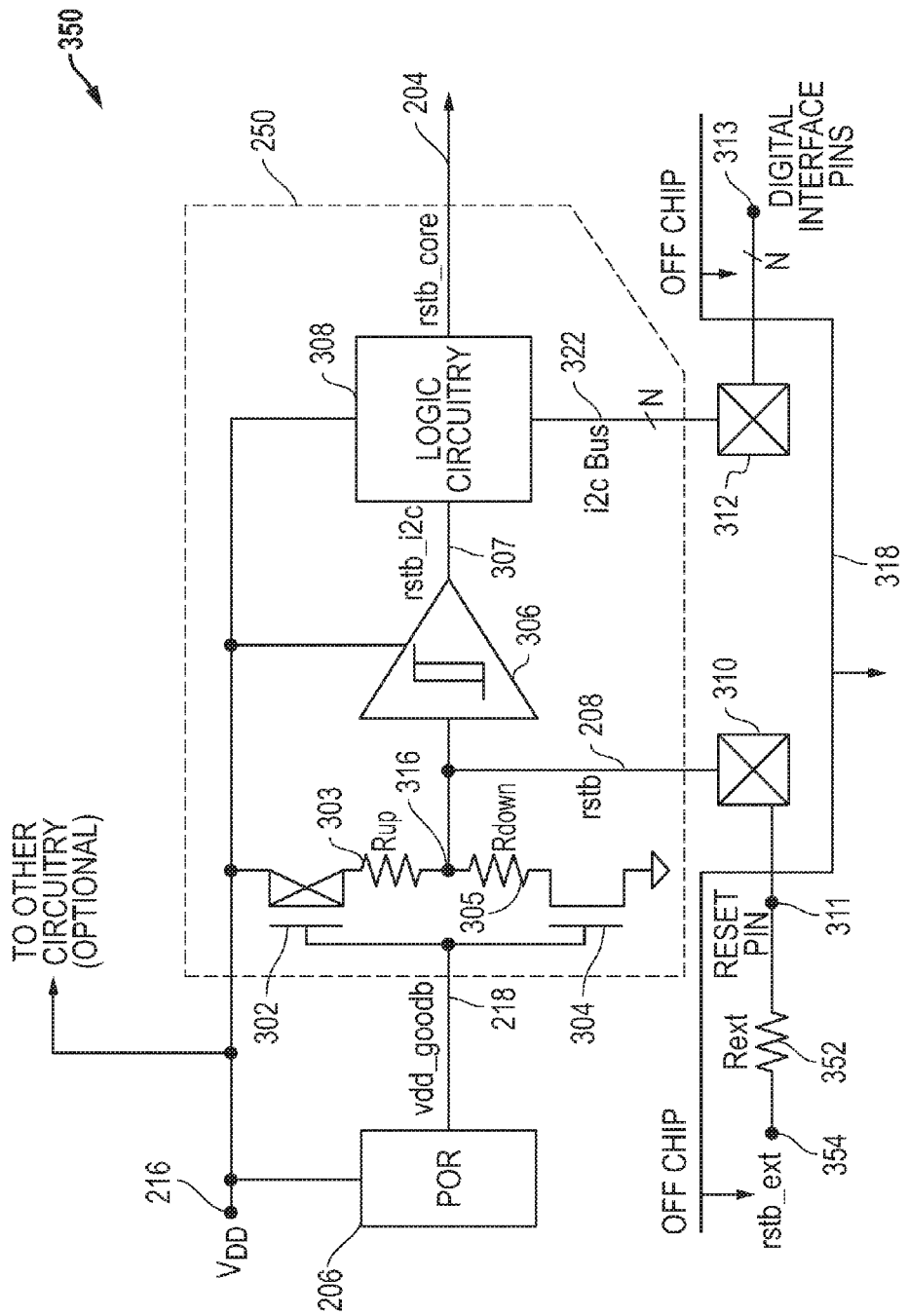
FIG. 3C is a circuit diagram for the embodiment of FIG. 3A where the internal reset control circuitry is configured to rely upon an external reset signal.

In operation, embodiment 320 of FIG. 3B relies upon the internal supply-good signal (vdd_goodb) 218 to generate the internal reset control signal (rstb_core) 204. In this configuration, the external resistor ($R_{EXT}$) 352 in FIG. 3C is not needed, and the reset pad 310 is left floating. The capacitor ($C_{DELAY}$) 314 is optional and can be coupled between reset pin 311 and ground, if desired. As described above, the POR circuitry 206 monitors the supply voltage ($V_{DD}$) 216 and releases the supply-good signal (vdd_goodb) 218 when the supply voltage ($V_{DD}$) 216 has reached a threshold voltage that is high enough for proper operation. The inverter 302/304 and the Schmitt trigger 306 then release the reset signal (rstb_i2c) 307 indicating that the supply voltage ($V_{DD}$) 216 has reached a level that provides for safe functioning of the circuitry being powered by the supply voltage ($V_{DD}$) 216, such as the logic circuitry 308.

It is noted that the capacitor ($C_{DELAY}$) 314 can be used in combination with the pull-up resistor ($R_{UP}$) 303 to define a minimum delay between the time the supply voltage ($V_{DD}$) 216 reaches the selected threshold and the time that the reset signal (rstb_i2c) 307 is released. Further, to address a possible brown-out of the supply voltage ($V_{DD}$) 216, the pull-down resistor ($R_{DOWN}$) 305 can be configured to be much less than the pull-up resistor ($R_{UP}$) 303, which can be used to define a minimum reset pulse width along with the capacitor ($C_{DELAY}$) 314, such that the logic circuitry 308 can safely be reset. In one example embodiment, the pull-up resistor 303 ($R_{UP}$) can be about 1 mega-ohms (MΩ); the pull-down resistor ($R_{DOWN}$) 305 can be about 20 kilo-ohms (kΩ); and the capacitor ($C_{DELAY}$) 314 can be about 5 pico-farads (pF). These example values create about a 5 micro-second (μs) minimum reset pulse width. It is noted that the capacitor ($C_{DELAY}$) 314 can also be located on chip, if desired, to provide for a sufficiently wide minimum reset pulse width. For example, a 5 pF capacitor could be coupled within the integrated circuit between the reset pad 310 and ground to provide the capacitor ($C_{DELAY}$) 314, thereby ensuring a minimum reset pulse width. If desired, additional external capacitance could then be coupled between the reset pin 311 and ground to provide a larger capacitance and thereby a larger reset pulse width.

It is further noted that if the entire IC is to be powered by the supply voltage ($V_{DD}$) 216, the reset signal (rstb_i2c) 307 can be provided to any other desired block on the IC. However, in many ICs, multiple supply voltages are used with different ramp-up transients. As such, it is difficult, of not impossible, to guarantee that when one supply voltage has reached a safe threshold, every other supply voltage used by the IC has also reached a safe voltage level. A brute force solution to this problem would be to design POR and related reset control circuitry for each of the power supplies and combine them such that the reset signal is released only when all of the supply voltages have reached their safe levels. However, such a brute force solution would be complicated and may not work properly.

This problem can be solved by decoupling the internal reset control signal (rstb_core) 204 from the reset signal (rstb_i2c) 307, such that the internal reset control signal (rstb_core) 204 can only be de-asserted through a digital interface transaction. As a result, the releasing of internal reset control signal (rstb_core) 204 is under full control of the user (e.g., a host processor) through issuing reset control signals through the digital interface bus (i2cbus) 322. The assumption is that the user (e.g., host processor) always knows when the supplies are up and has control of when to release the reset. It is noted that in case of an internal supply voltage brown-out that is not monitored by the POR circuitry 206, the IC will not reset. However, the user can assert/release the internal reset control signal (rstb_core) 204 and start a re-initialization process through digital interface commands. The information about an internal supply voltage brown-out can also be provided to the user by setting a register on the IC that can be read through the digital interface, thereby providing feedback to the host processor.

For the embodiments depicted, the POR circuitry 206 is used to reset the logic circuitry 308. The logic circuitry 308 can set the internal reset control signal (rstb_core) to zero (i.e., low logic level) as the reset state. The assertion of this reset state is configured to reset the rest of the integrated circuit. Once the POR circuitry 206 or external reset signal 354 has released the reset, the logic circuitry 308 still needs to be programmed through the digital interface in order to set the internal reset control signal (rstb_core) 204 to one (i.e., high logic level) as the non-asserted state. The POR circuitry 206 helps to guarantee that the logic circuitry 308 is correctly reset so that the digital interface 313 can be used to control the reset state for the integrated circuit. By doing so, the POR circuitry 206, or the overriding external reset signal 354, indirectly asserts the internal reset control signal. In other words, the reset of the integrated circuit core can be asserted by the POR circuitry 206, by an external reset signal 354 applied to the reset pin, or by a reset command issued through the digital interface bus 322. The reset condition for the integrated circuit can be de-asserted, however, only by a de-assertion command issued through the digital interface bus 322.

FIG. 3C is a circuit diagram for the embodiment of FIG. 3A where the internal reset control signal (rstb_core) 204 is configured to rely upon an external reset signal 354, labeled "rstb_ext," that is applied to the reset pin 311. In particular, for embodiment 350 depicted, the reset pad 310 is coupled to the external reset signal (rstb_ext) 354 through the external resistor ($R_{EXT}$) 352.

In operation, embodiment 350 of FIG. 3C relies upon the external reset signal (rstb_ext) 354 to generate the internal reset control signal (rstb_core) 204. In this case, an external resistor ($R_{EXT}$) 352 is coupled to the reset pin 311 and to the external reset signal (rstb_ext) 354. For this configuration, the external resistor ($R_{EXT}$) 352 is be configured such that the external resistor ($R_{EXT}$) 352 is much less than the pull-down resistor ($R_{DOWN}$) 305, which is in turn much less than the pull-up resistor ($R_{UP}$) 303 as indicated above. As such, the functionality of the POR circuitry 206 is overridden by the external reset signal (rstb_ext) 354, and the state of the reset signal (rstb_i2c) 307 is independent of the monitoring of the supply voltage ($V_{DD}$) 216 provided by the on-chip POR circuitry 206. For example, the pull-down resistor ($R_{DOWN}$) 305 can be configured to be at least one order of magnitude greater in resistance than the external resistor ($R_{EXT}$) 352. The pull-up resistor ($R_{UP}$) 303 is usually selected to be large because it determines the minimum reset pulse in combination with the capacitor ($C_{DELAY}$) 314 (e.g., $t_{RESET} \approx R_{UP} * C_{DELAY}$), as described above. Where the capacitor ($C_{DELAY}$) 314 is included within the integrated circuit, pull-up resistor ($R_{UP}$) 303 is preferably large in order to keep small the on-chip area for the capacitor ($C_{DELAY}$) 314. Thus, the pull-up resistor ($R_{UP}$) 303 will typically end up being at least one order of magnitude greater than the pull-down resistor ($R_{DOWN}$) 305, where an on-chip capacitor ($C_{DELAY}$) 314 is used. In one example embodiment, the external resistor ($R_{EXT}$) 352, if used, can be about 2 kilo-ohms (kΩ); the pull-up resistor ($R_{UP}$) 303 can be about 1 mega-ohms (MΩ); the pull-down resistor ($R_{DOWN}$) 305 can be about 20 kilo-ohms (kΩ); and an on-chip capacitor ($C_{DELAY}$) 314 can be used and be about 5 pico-farads (pF).

For FIGS. 3A-C, it is noted that that the reset signal (rstb_i2c) 307 is provided to the logic circuitry 308, which in turn provides the internal reset control signal (rstb_core) 204. In this configuration, an additional digital interface (e.g. I2C)

transaction is provided to the logic circuitry 308 through the digital interface bus 322 to provide a command that releases the internal reset control signal (rstb_core) 204. If desired, this release operation can be configured to be transparent to the user. For example, the IC will typically need to be initialized through the digital interface after a reset is released. As such, the releasing of internal reset control signal (rstb_core) 204 can be implemented with an extra digital interface command that is automatically merged by the IC when an initialization sequence is initiated by the user (e.g., host processor).

Figure 3D:
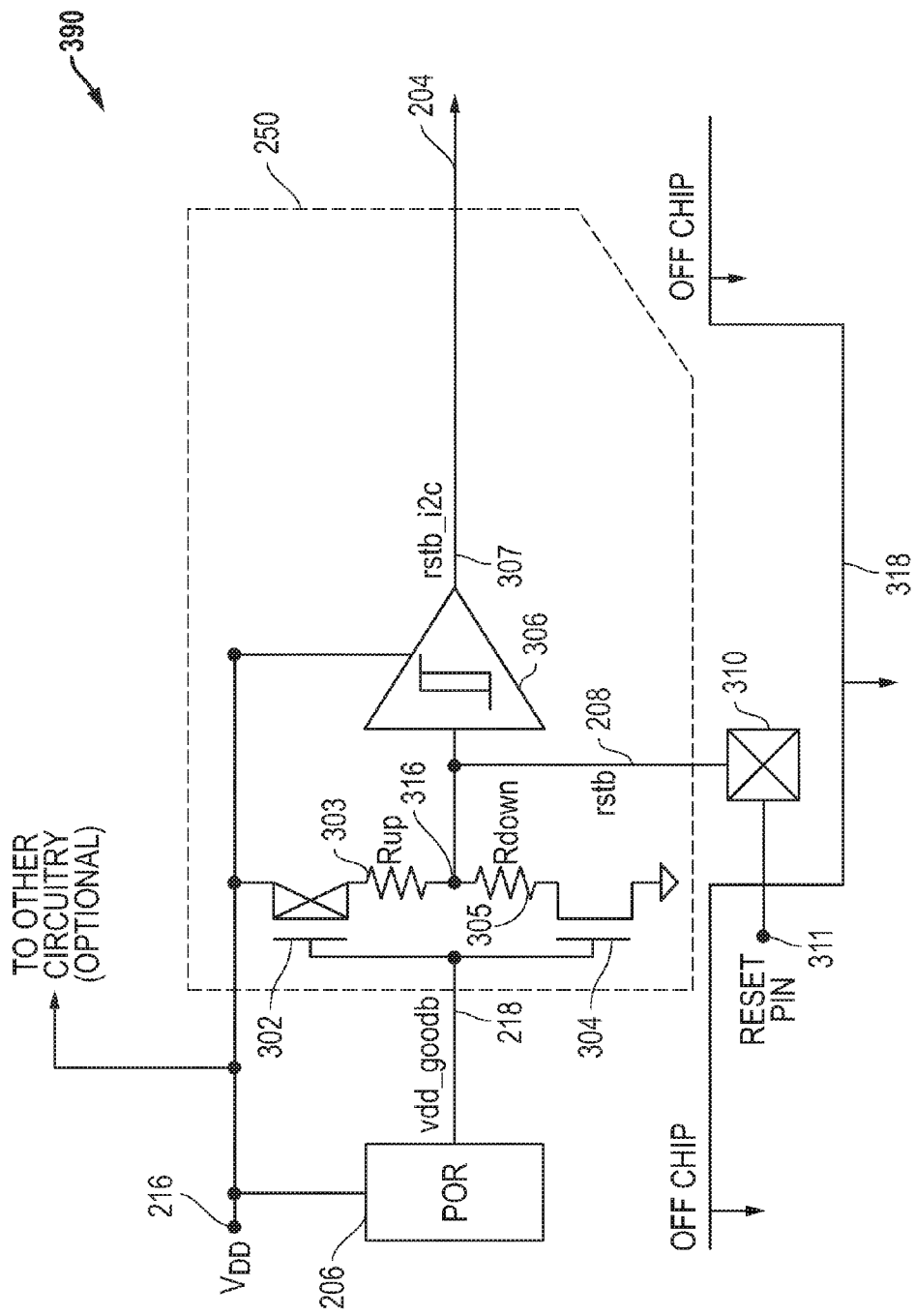
FIG. 3D is a circuit diagram for the embodiment of FIG. 3A that does not utilize additional logic circuitry to control when an internal reset control signal can be released.

FIG. 3D is a circuit diagram of the embodiment of FIG. 3A where the logic circuitry 308 is not utilized to control the release of the reset signal. As depicted, embodiment 390 provides the reset signal (rstb_i2C) 307 form the Schmitt trigger 306 as the internal reset control signal 204 from the reset control circuitry 250. As indicated above, embodiment 390 could be utilized, for example, where the reset signal (rstb_i2c) 307 is being used as an internal reset signal for the entire integrated circuit. Such an implementation may be desirable, for example, where the supply voltage ($V_{DD}$) 216 is being used to power all of the circuitry on the integrated circuit.

It is again noted that the externally configurable POR system embodiments and related methods described herein can be utilized with any desired integrated circuit. However, allowing the reset to be controlled between an external reset signal and an internal reset signal based upon external components, as described herein, provides an advantageous solution for TV tuner ICs so that a single integrated circuit design can be utilized to provide both an externally controlled reset solution and an internally controlled reset solution.

Figure 4:
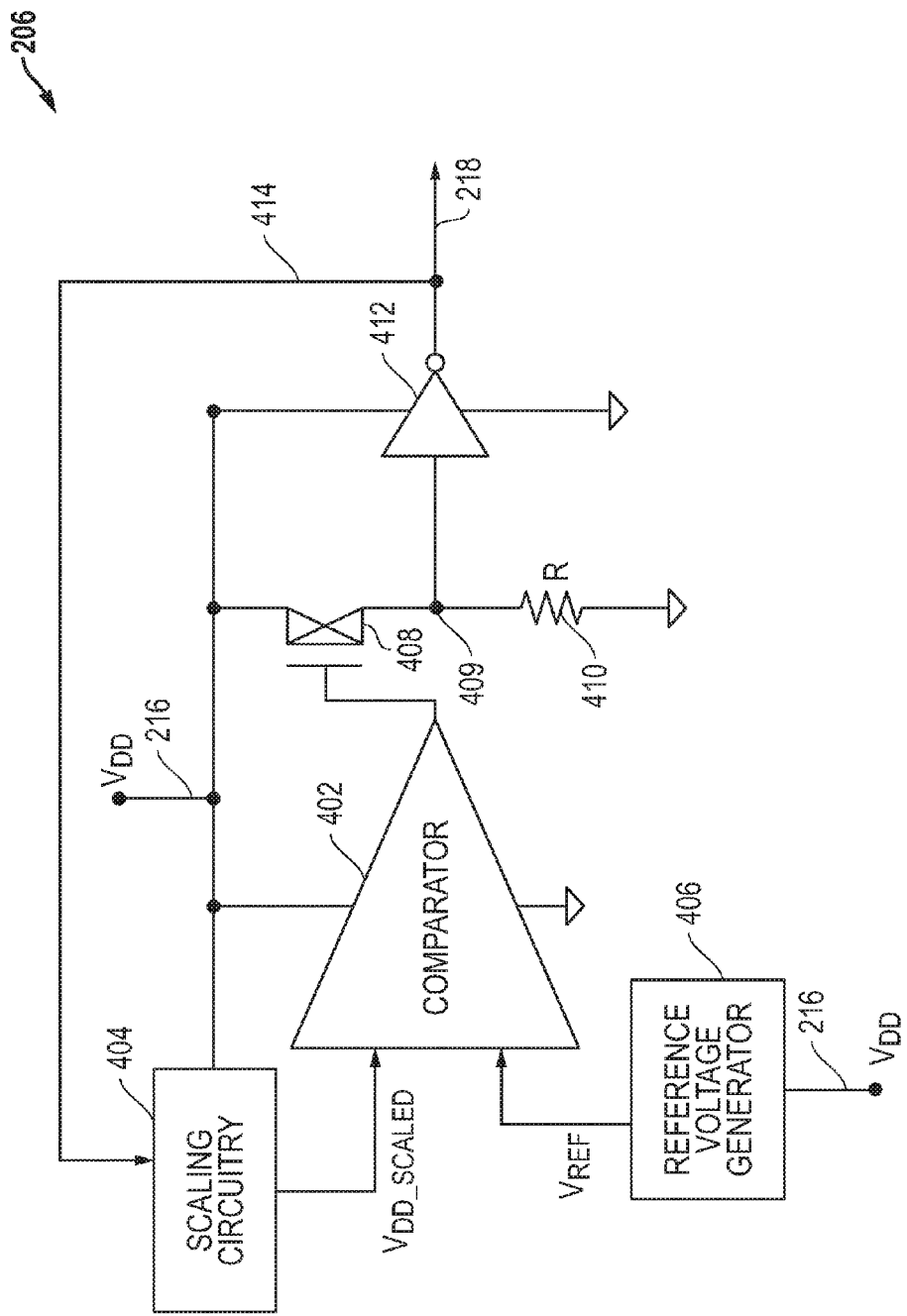
FIG. 4 is a circuit diagram for an embodiment of power-on-reset circuitry.

FIG. 4 is a circuit diagram for an example embodiment for POR circuitry 206. A comparator 402 receives a reference voltage ($V_{REF}$) from a reference voltage generator 406 and a scaled version of the voltage supply ($V_{DD\_SCALED}$) from scaling circuitry 404. The scaling circuitry 404 can also receive the supply-good signal 218 as a feedback signal 414. The comparator will output a low voltage level to the gate of PMOS transistor 408 until the voltage level of the scaled voltage supply ($V_{DD\_SCALED}$) rises above the voltage level of the reference voltage ($V_{REF}$). Once this occurs, the comparator will output a high voltage level to the gate of PMOS transistor 408. When source and drain of PMOS transistor 408 is coupled between the supply voltage ($V_{DD}$) 216 and node 409. Node 409 is connected to ground through resistor (R) 410, which can be 500 kilo-ohms (kΩ). Node 409 will remain tied to ground through resistor (R) 410 until the output of the comparator transitions to a high voltage level when the scaled voltage supply ($V_{DD\_SCALED}$) rises above the voltage level of the reference voltage ($V_{REF}$), thereby turning on PMOS transistor 408 and forcing the voltage on node 409 to a high voltage level. Node 409 is also coupled the input of inverter 412. As such, the supply-good signal 218 will follow the voltage level of the supply voltage ($V_{DD}$) 216 until node 409 is forced to a high voltage level, thereby driving the supply-good signal 218 to a low voltage level. It is noted that that comparator 402 can be configured to operate with hysteresis by changing the supply voltage ($V_{DD}$) scaling factor depending on the level of the signal 414. This hysteresis helps, for example, to prevent the comparator 402 from chattering in the case where the supply voltage dips right after the reset is released. And it is again noted that the POR circuitry 206 could be implemented differently, as desired, while still taking advantage of the externally configurable POR systems and methods described herein.

Further modifications and alternative embodiments of this invention will be apparent to those skilled in the art in view of this description. It will be recognized, therefore, that the present invention is not limited by these example arrangements. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the implementations and architectures. For example, equivalent elements may be substituted for those illustrated and described herein, and certain features of the invention may be utilized independently of the use of other features, all as would be apparent to one skilled in the art after having the benefit of this description of the invention.

What is claimed is:

1. An externally configurable power-on-reset system for an integrated circuit, comprising:
    power-on-reset circuitry within the integrated circuit configured to receive a supply voltage and to generate a supply-good signal when the supply voltage has reached a threshold voltage level; and
    reset control circuitry within the integrated circuit coupled to receive the supply-good signal, coupled to a reset pin for the integrated circuit, and configured to output an internal reset control signal for the integrated circuit;
    wherein the reset control circuitry is further configured to rely upon the supply-good signal to generate the internal reset control signal if an external reset signal is not applied to the reset pin, and wherein the reset control circuitry is configured to rely upon the external reset signal to generate the internal reset control signal if the external reset signal is applied to the reset pin; and
    wherein the reset control circuitry comprises:
        an inverter coupled between the supply voltage and ground, the inverter receiving the supply-good signal as an input and providing an output signal to an internal node, the internal node also being coupled to the reset pin for the integrated circuit; and
        a Schmitt trigger coupled to the internal node and configured to provide a reset signal as an output, the reset signal being used to provide the internal reset control signal.

2. The externally configurable power-on-reset system of claim 1, wherein the reset control circuitry is further coupled to one or more digital interface pins for the integrated circuit, and wherein the reset control circuitry is further configured to receive a reset control signal through the one or more digital interface pins.

3. The externally configurable power-on-reset system of claim 2, wherein the reset control circuitry is further configured to assert the internal reset control signal based upon the supply-good signal or the external reset signal and to utilize the reset control signal to determine when the internal reset control signal can be de-asserted.

4. The externally configurable power-on-reset system of claim 3, wherein the reset control circuitry comprises logic circuitry coupled to the digital interface pins.

5. The externally configurable power-on-reset system of claim 1, wherein the inverter comprises a PMOS transistor having its gate coupled to the supply-good signal and its source and drain coupled between the supply voltage and a pull-up resistor, and the inverter comprises an NMOS transistor having its gate coupled to the supply-good signal and its source and drain coupled between the supply voltage and a pull-down resistor, wherein the pull-up resistor and the pull-down resistor are each coupled to the internal node.

6. The externally configurable power-on-reset system of claim 5, further comprising an internal capacitor coupled to the reset pin to determine at least in part a minimum reset pulse width along with the pull-up resistor, and wherein the resistance for the pull-up resistor is greater than the resistance for the pull-down resistor by at least one order of magnitude.

7. The externally configurable power-on-reset system of claim 1, wherein the reset control circuitry is configured not to utilize a reset control signal from digital interface pins to determine when the internal reset control signal can be de-asserted.

8. A method of providing a power-on-reset for an integrated circuit, comprising:
    monitoring a supply voltage within the integrated circuit;
    generating a supply-good signal within the integrated circuit when the supply voltage has reached a threshold voltage level;
    receiving the supply-good signal with an inverter coupled between the supply voltage and ground;
    providing the output of the inverter to an internal node that is also coupled to a reset pin for the integrated circuit;
    utilizing a Schmitt trigger coupled to the internal node to provide a reset signal;
    utilizing the reset signal to provide the internal reset control signal; and
    if an external reset signal is not applied to the reset pin, utilizing the supply-good signal to control the reset signal output by the Schmidt trigger; and
    if the external reset signal is applied to the reset pin, utilizing the external reset signal applied to the reset pin to control the reset signal output by the Schmidt trigger.

9. The method of claim 8, wherein no external reset signal is received at the reset pin, and the supply-good signal is used to generate the internal reset control signal.

10. The method of claim 9, receiving a reset control signal through one or more digital interface pins for the integrated circuit.

11. The method of claim 10, further comprising asserting the internal reset control signal based upon the supply-good signal and utilizing the reset control signal to determine when the internal reset control signal can be de-asserted.

12. The method of claim 9, further comprising receiving the supply-good signal with an inverter, providing the output of the inverter to the internal node, utilizing a Schmitt trigger coupled to the internal node to provide a reset signal, and utilizing the reset signal to provide the internal reset control signal.

13. The method of claim 9, further comprising using an external capacitor coupled to the reset pin to determine at least in part a minimum reset pulse width.

14. The method of claim 9, further comprising using an internal capacitor coupled to the reset pin to determine at least in part a minimum reset pulse width.

15. The method of claim 8, wherein an external reset signal is received at the reset pin, and the external reset signal applied to the reset pin is used to generate the internal reset control signal.

16. The method of claim 15, further comprising applying the external reset signal to the reset pin through an external resistor.

17. The method of claim 15, receiving a reset control signal through one or more digital interface pins for the integrated circuit.

18. The method of claim 17, further comprising asserting the internal reset control signal based upon the external reset signal and utilizing the reset control signal to determine when the internal reset control signal can be de-asserted.

19. The method of claim 8, further comprising applying the external reset signal to the reset pin through an external resistor.

20. The method of claim 19, wherein the inverter comprises a pull-up resistor and a pull-down resistor, and wherein the pull-up resistor has a greater resistance than the pull-down resistor by at least one order of magnitude and wherein the pull-down resistor has a greater resistance than the external resistor by at least one order of magnitude.

* * * * *